United States Patent
Ko et al.

(10) Patent No.: US 10,319,500 B2
(45) Date of Patent: Jun. 11, 2019

(54) SUPERCONDUCTING WIRE MATERIAL HAVING LAMINATED STRUCTURE AND MANUFACTURING METHOD THEREFOR

(71) Applicant: KOREA ELECTROTECHNOLOGY RESEARCH INSTITUTE, Changwon (KR)

(72) Inventors: Rock Kil Ko, Changwon (KR); Seog Whan Kim, Changwon (KR); Young Sik Jo, Gimhae (KR); Dong Woo Ha, Changwon (KR)

(73) Assignee: KOREA ELECTROTECHNOLOGY RESEARCH INSTITUTE, Changwon (KR)

( * ) Notice: Subject to any disclaimer, the term of this patent is extended or adjusted under 35 U.S.C. 154(b) by 0 days.

(21) Appl. No.: 14/900,103

(22) PCT Filed: Dec. 10, 2013

(86) PCT No.: PCT/KR2013/011390
§ 371 (c)(1),
(2) Date: Dec. 18, 2015

(87) PCT Pub. No.: WO2014/208843
PCT Pub. Date: Dec. 31, 2014

(65) Prior Publication Data
US 2016/0155543 A1    Jun. 2, 2016

(30) Foreign Application Priority Data

Jun. 28, 2013   (KR) .................. 10-2013-0075458

(51) Int. Cl.
*H01B 13/00*   (2006.01)
*H01L 39/24*   (2006.01)
(Continued)

(52) U.S. Cl.
CPC ....... *H01B 13/0036* (2013.01); *B23K 1/0016* (2013.01); *B23K 1/19* (2013.01);
(Continued)

(58) Field of Classification Search
CPC ....... H01L 39/02; H01L 39/14; H01L 39/143; H01L 39/248; H01L 39/2461;
(Continued)

(56) References Cited

U.S. PATENT DOCUMENTS 6,444,917 B1 * 9/2002 Scudiere ............... H01L 39/248
505/237
6,925,316 B2 * 8/2005 Rey ......................... H01B 1/08
505/211
(Continued)

FOREIGN PATENT DOCUMENTS

EP   1788641 A2 *  5/2007  ........... H01L 39/143
JP   2005-044636 A   2/2005
(Continued)

OTHER PUBLICATIONS

Iwakuma (EP 1788641 A2) included with Office Action.*
(Continued)

*Primary Examiner* — Roshn K Varghese

(57) ABSTRACT

Disclosed is a method for manufacturing a superconducting wire material having a laminated structure. The present invention provides a method for manufacturing a laminated superconducting wire material, comprising the steps of: providing a deposition substrate having a predetermined width; sequentially forming, on the deposition substrate, a laminated structure including a buffer layer, a superconducting layer and a stabilization layer, thereby forming, on both sides of the deposition substrate, regions in which a metal substrate is exposed in the width direction; providing a lamination substrate, having a width corresponding to the (Continued)

deposition substrate, to the laminated structure; and providing solder to the regions, in which the metal substrate is exposed, to thereby bond the deposition substrate and the lamination substrate.

3 Claims, 16 Drawing Sheets

(51) Int. Cl.
| | |
|---|---|
| *B23K 1/00* | (2006.01) |
| *B23K 1/20* | (2006.01) |
| *B23K 26/362* | (2014.01) |
| *B23K 26/402* | (2014.01) |
| *H01B 12/06* | (2006.01) |
| *B23K 1/19* | (2006.01) |
| *B23K 26/364* | (2014.01) |
| *B23K 101/32* | (2006.01) |
| *B23K 101/38* | (2006.01) |
| *B23K 103/12* | (2006.01) |
| *B23K 103/18* | (2006.01) |
| *B23K 103/00* | (2006.01) |

(52) U.S. Cl.
CPC ............. *B23K 1/20* (2013.01); *B23K 26/362* (2013.01); *B23K 26/364* (2015.10); *B23K 26/402* (2013.01); *H01B 12/06* (2013.01); *H01L 39/2461* (2013.01); *B23K 2101/32* (2018.08); *B23K 2101/38* (2018.08); *B23K 2103/12* (2018.08); *B23K 2103/26* (2018.08); *B23K 2103/50* (2018.08)

(58) Field of Classification Search
CPC ..... H01L 39/2422; H01B 12/02; H01B 12/04; H01B 12/06; H01B 13/0036; Y10S 505/885; B23K 26/364
USPC ............. 174/84 R, 125.1; 505/230, 234, 238
See application file for complete search history.

(56) References Cited

U.S. PATENT DOCUMENTS

| | | | |
|---|---|---|---|
| 2006/0040830 A1* | 2/2006 | Thieme | H01L 39/143 505/231 |
| 2006/0073979 A1* | 4/2006 | Thieme | H01L 39/143 505/434 |
| 2009/0298696 A1* | 12/2009 | Otto | H01L 39/02 505/230 |
| 2011/0218112 A1* | 9/2011 | Ha | H01L 39/143 505/230 |
| 2012/0065074 A1* | 3/2012 | Xie | H01R 4/68 505/234 |
| 2012/0245034 A1 | 9/2012 | Machi et al. | |
| 2013/0137579 A1* | 5/2013 | Nagasu | H01B 12/02 505/150 |

FOREIGN PATENT DOCUMENTS

| | | |
|---|---|---|
| JP | 2008-243588 A | 10/2008 |
| JP | 2008-244249 A | 10/2008 |
| JP | 2009-016257 A | 1/2009 |
| JP | 2009-507358 A | 2/2009 |
| JP | 2011-069566 A | 5/2011 |
| JP | 2012-169237 A | 9/2012 |
| KR | 10-2008-0066655 A | 7/2008 |
| KR | 10-2012-0120119 A | 11/2012 |
| WO | WO 2008/036073 A2 | 3/2008 |

OTHER PUBLICATIONS

An English Machine Translation of Toshiba (JP 2008-244249A).*
Alternative version of an English Machine Translation of Toshiba (JP 2008-244249A).*
International Search Report for PCT/KR2013/011390 filed on Dec. 10, 2013.

* cited by examiner

<PRIOR ART>

SUPERCONDUCTING WIRE MATERIAL HAVING LAMINATED STRUCTURE AND MANUFACTURING METHOD THEREFOR

CROSS-REFERENCE TO RELATED APPLICATIONS

The present application is a National Stage of International Patent Application No. PCT/KR2013/011390 filed on Dec. 10, 2013, which claims priority to Korean Patent Application No. 10-2013-0075458 filed on Jun. 28, 2013, the disclosures of which are hereby incorporated in their entirety by reference.

TECHNICAL FIELD

The present invention relates to a method for manufacturing a superconducting wire material, and more specifically to a superconducting wire material having a laminated structure for supplementing mechanical properties of the superconducting wire material.

BACKGROUND ART

Superconducting wire materials have ceramics materials of superconducting layers, etc., and multi-layered thin film structures of metal layers.

FIG. 1 is an exemplary view illustrating a superconducting wire material based on Rolling Assisted Bi-axially Textured Substrate (RABiTS). Referring to FIG. 1, the superconducting wire material includes a buffer layer 14, a superconducting layer 16 and a stabilization layer 18 sequentially formed on a Ni or Ni alloy substrate 12.

A high-temperature superconducting wire material based on RABITS is thin and has ductility. Thus, in order to provide rigidity, a metal substrate 20 such as stainless steel, etc., is laminated on and below the superconducting wire material. In this case, the laminated substrate is combined by a solder 30 to have a high mechanical strength and is effective in reducing magnet property degradation generated during coil winding. However, there is a problem that the metal is laminated on both surfaces of the substrate, and thereby the entire wire material becomes thicker and current density Je becomes lower.

Meanwhile, a superconducting wire material based on Ion Beam Assistes Deposition (IBAD) forms a superconducting layer on a Hastelloy-based metal substrate with a relatively high strength. Even in this case, when a lamination substrate is used on both sides of the wire material, the wire material would have high rigidity which makes coil winding difficult, and would have a mechanical strength more than is required. Accordingly, current density would become lower.

SUMMARY OF THE INVENTION

In order to solve the problems of related art as above, the present invention aims to provide a novel laminated structure of a superconducting wire material which prevents a decrease in current density while maintaining a proper strength of a wire material.

Also, the present invention aims to provide a method for manufacturing a superconducting wire material having a novel laminated structure.

Also, the present invention aims to provide a novel technique applicable to laminating of a superconducting wire material consisting of two superconducting laminated structures opposing to each other.

In order to achieve the technical objects, the present invention provides a method for manufacturing a laminated superconducting wire material, including the steps of providing a deposition substrate having a predetermined width; sequentially forming, on the deposition substrate, a laminated structure including a buffer layer, a superconducting layer and a stabilization layer, thereby forming, on both sides of the deposition substrate, regions in which a metal substrate is exposed in the width direction; providing a lamination substrate, having a width corresponding to the deposition substrate, to the laminated structure; and providing a solder to the regions, in which the metal substrate is exposed, to thereby bond the deposition substrate and the lamination substrate.

The step of forming the laminated structure according to the present invention may include the steps of forming a buffer layer, a superconducting layer and a stabilization layer on the deposition substrate; and removing part of the buffer layer, the superconducting layer and the stabilization layer to form the regions in which the metal substrate is exposed.

In this case, the step of forming the regions in which the metal substrate is exposed is performed by laser ablation, or by a method etching with a mask pattern corresponding to the regions in which the metal substrate is exposed.

In order to achieve another technical objects, the present invention provides a superconducting wire material having a laminated structure, including a deposition substrate; a laminated structure including a buffer layer, a superconducting layer and a stabilization layer sequentially laminated on the deposition substrate; a lamination substrate formed on the laminated structure; and a solder filling a space formed by regions in which a metal substrate is exposed to bond the deposition substrate and the lamination substrate, wherein the laminated structure forms the regions in which the metal substrate is exposed in the width direction on both sides of the deposition substrate.

The lamination substrate according to the present invention may include one material selected from the group consisting of stainless steel, a copper alloy and a nickel alloy.

Also, the solder according to the present invention may include at least one metal selected from the group consisting of silver, lead, tin, bismuth, aluminum, zinc and indium, or an alloy thereof.

Also, the present invention may further include a second lamination substrate below the deposition substrate.

In order to achieve another technical objects, the present invention provides a superconducting wire material having a laminated structure, including a deposition substrate; a pair of laminated structures opposing to each other, including a buffer layer, a superconducting layer and a stabilization layer sequentially laminated on the deposition substrate; and a solder filling a space formed by regions in which a metal substrate is exposed to bond the pair of laminated structures, wherein the pair of laminated structures form the regions in which the metal substrate is exposed in the width direction on both sides of the deposition substrate.

Also, the present invention may further include a plating layer covering the outside of the pair of laminated structures opposing to each other.

Also, the present invention may further include a lamination substrate on or below the pair of laminated structures opposing to each other. In this case, the lamination substrate may protrude in the width direction of the laminated structures, and the lamination substrate may be bonded to the laminated structures by the solder.

According to the present invention, a structure of a superconducting wire material which inhibits a decrease in current density during lamination for providing optimal rigidity to a wire material, and a lamination technique therefor may be provided.

Additionally, the method according to the present invention may provide a lamination technique capable of bonding two superconducting wire materials opposing to each other without adding an additional lamination substrate.

BEST MODE FOR CARRYING OUT THE INVENTION

Hereinafter, the present invention will be described by explaining preferable embodiments of the present invention with reference to the drawings.

Figure 1:
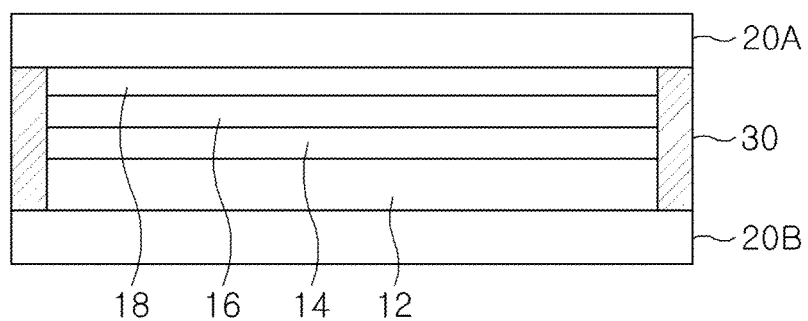
FIG. 1 is an exemplary view illustrating a laminated structure of a conventional superconducting wire material.
Figure 2:
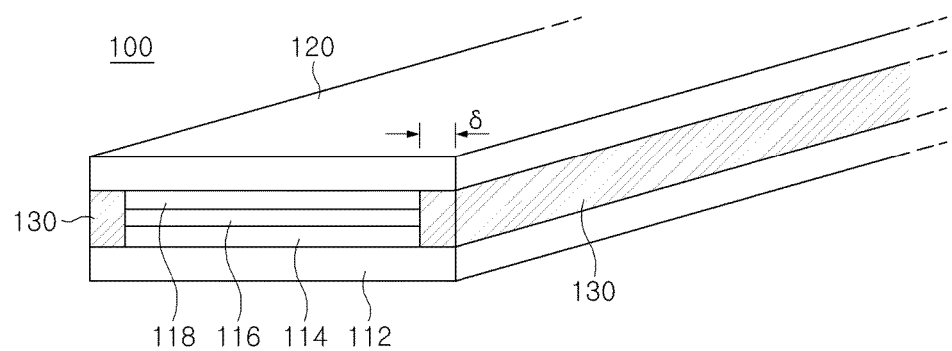
FIG. 2 is an exemplary view illustrating a laminated structure of a superconducting wire material according to an embodiment of the present invention.

FIG. 2 is an exemplary view illustrating a superconducting wire material having a laminated structure according to a preferable embodiment of the present invention.

Referring to FIG. 2, a superconducting wire material 100 has a strip shape of a predetermined width extending in a longitudinal direction. The superconducting wire material includes a laminated structure of a deposition substrate 112, a buffer layer 114, a superconducting layer 116, a stabilization layer and a lamination substrate 120.

A structure of the deposition substrate 112, the buffer layer 114, the superconducting layer 116 and the stabilization layer 118 forming the wire material 110 of the present invention and a method for manufacturing the same may be manufactured by a typical method which is obvious to a skilled person in the art to which the present invention pertains.

A series of material layers 114, 116 and 118 including the superconducting layer 116 are deposited on the deposition substrate 112. The series of material layers 114, 116 and 118 of the present invention are formed such that part of the metal substrate is exposed by a predetermined distance (δ) in the width direction for the deposition substrate. The exposure distance of the metal substrate may be properly selected by a skilled person in the art with reference to the present invention which will be described below. The distance in which the metal substrate is exposed may be properly design in consideration of a handling of solder, a width of substrate, a bonding strength of substrate, etc. For example, for the distance in which the metal substrate is exposed, less than several mm may be allowed, and at least several cm may be allowed.

A base used for manufacturing a common superconducting wire material may be used as the deposition substrate 112. For example, the deposition substrate may be implemented as a metal substrate including nickel or a nickel alloy. A series of material layers 114, 116 and 118 including a superconducting layer are deposited on the deposition substrate 112. The material and thickness of the deposition substrate of the present invention may vary depending on the use of a superconducting product.

The buffer layer 114 is interposed between the superconducting layer 116 and the deposition substrate 112 and acts as a layer for providing a crystallographic orientation in order for the superconducting layer 116 following to show superconductivity properties. The buffer layer 114 may be formed of at least one material selected from the group consisting of MgO, LMO, STO, $ZrO_2$, $CeO_2$, YSZ, $Y_2O_3$ and $HfO_2$. The buffer layer 114 may be formed as a single layer or plural layers depending on the use of the superconducting product and a manufacturing method therefor.

Additionally, the superconducting layer 116 may be composed of a superconducting material including yttrium or a rare earth (RE) element. For example, an Y123 superconducting material represented by $YBa_2Cu_3O_7$ or an RE123 superconducting material may be used. Also, a Bi-based superconducting material may be used as the superconducting layer 116.

The stabilization layer 118 is provided for electrical stabilization of the superconducting wire material, such as for protecting the superconducting layer from an overcurrent, providing stability against quench, etc. The stabilization layer 118 of the present invention may include at least two layers. For example, the stabilization layer 118 may include a first conductive metal layer formed on the superconducting layer 116 and a second conductive metal layer formed on the first conductive metal layer. In this case, the first and second metal layers may be formed of any conductive metal layers. For example, the first metal layer may be composed of at least one metal selected from the jewelry group consisting of gold, silver, platinum, palladium, etc., or an alloy thereof, and the second metal layer may be composed of a conductive metal such as copper or aluminum, or an alloy thereof.

The stabilization layer 118 may be formed by common techniques such as common physical vapor deposition, sputtering and electroplating.

A lamination substrate 120 is provided on the stabilization layer 118. The lamination substrate 120 may be formed of a metal material having rigidity. For example, a copper alloy or a nickel alloy such as stainless steel or brass may be used as the lamination substrate 120.

The lamination substrate 120 is opposite to the deposition substrate 112, and is bonded to the deposition substrate 112 by welding. For this, the lamination substrate 120 may have a proper width. In the present invention, the lamination substrate 120 may be designed to have substantially the same width as the deposition substrate 112, and may be designed to have a greater or a smaller width than the deposition substrate 112.

A solder 130 is formed in regions in which a metal substrate between the deposition substrate 112 and the lamination substrate 120 is exposed. The solder 130 may be made of at least one metal selected from the group consisting of silver, lead, tin, bismuth, aluminum, zinc and indium, or an alloy thereof. The solder 130 bonds the deposition substrate 112 and the lamination substrate 120 to finally provide rigidity to the superconducting wire material.

As described above, the present invention may reduce the total cross sectional area of the superconducting wire material by using the deposition substrate used for depositing the superconducting wire material as the laminated substrate. Accordingly, the present invention may provide a superconducting wire material with no decrease in current density Je while providing rigidity necessary for winding or handling the superconducting wire material.

MODE FOR CARRYING OUT THE INVENTION

Figure 3:
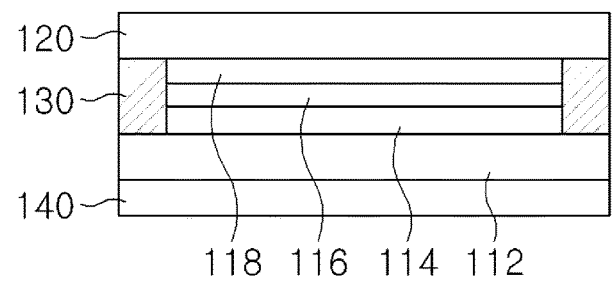
FIG. 3 is a view illustrating a cross section of a laminated structure of a superconducting wire material according to another embodiment of the present invention.

Meanwhile, the superconducting wire material of the present invention may use an additional rigid substrate below the deposition substrate according to necessity.
s
FIG. 3 is a view illustrating a cross section of a structure in which an additional lower lamination substrate 140 is used below the deposition substrate.

In the present embodiment, as illustrated in FIG. 3, the solder 130 is provided between the deposition substrate 112 and the upper lamination substrate 120. In the present embodiment, the bonding of the lower lamination substrate 140 may be performed by additional soldering. Or, of course, a simultaneous bonding may be performed by providing an additional solder around an interface between the deposition substrate 112 and the lower lamination substrate 140 during a soldering process of the deposition substrate 112 and the upper lamination substrate 120.

Hereinafter, a method for manufacturing a superconducting wire material of the present invention will be explained, and another embodiment of a superconducting wire material regarding this will be described.

FIGS. 4 to 7 are cross-sectional views sequentially illustrating a method for laminating a superconducting wire material according to a preferable embodiment of the present invention.

Figure 4:
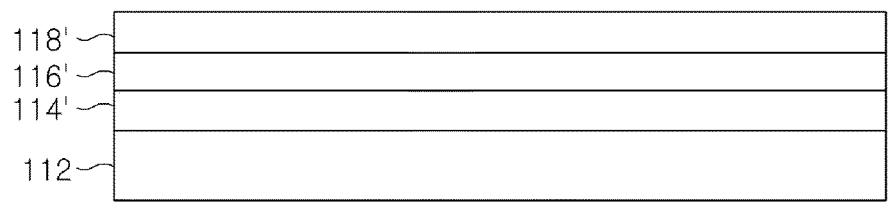
FIGS. 4 to 7 are cross-sectional views sequentially illustrating a method for laminating a superconducting wire material according to an embodiment of the present invention.

Referring to FIG. 4, a laminated structure including, on the entire surface of the deposition substrate 112, a buffer layer 114', a superconducting layer 116' and a stabilization layer 118' is sequentially formed. The buffer layer 114', the superconducting layer 116' and the stabilization layer 118' may be formed by common techniques which are well known to a skilled person in the art of the present invention. An explanation thereon is omitted.

Figure 5:
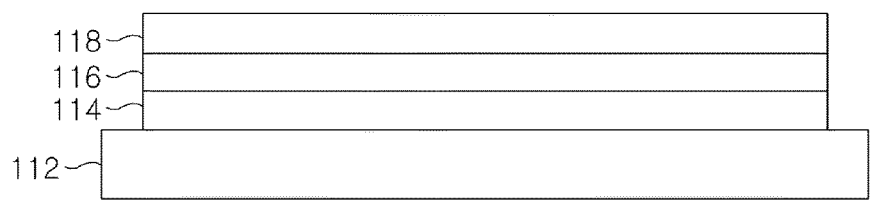

As illustrated in FIG. 5, part of a series of material layers forming the laminated structure on the deposition substrate 112 is removed to form laminated structure patterns 114, 116 and 118 in which a metal substrate is exposed in the width direction of the deposition substrate 112. In this case, the material layers can be removed by various ways. For example, laser ablation is a way suitable for selectively removing a material layer around an edge of the laminated structure to form a structure in which the metal substrate is exposed. Besides, a dry or a wet etching method applying common photolithography can be applied to the formation of structure in which the metal substrate is exposed.

Figure 6:
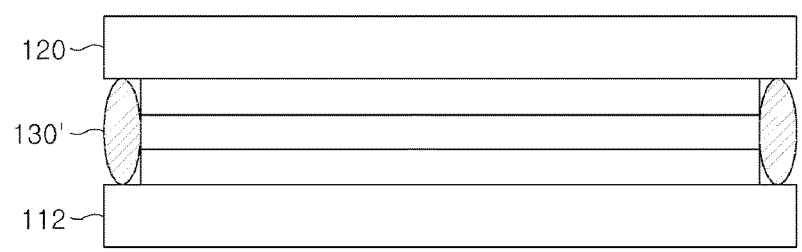

As illustrated in FIG. 6, the lamination substrate is arranged on the structure in which the metal substrate is exposed. The solder is provided in a space in which the metal substrate between the deposition substrate 112 and the lamination substrate 120 is exposed.

Figure 7:
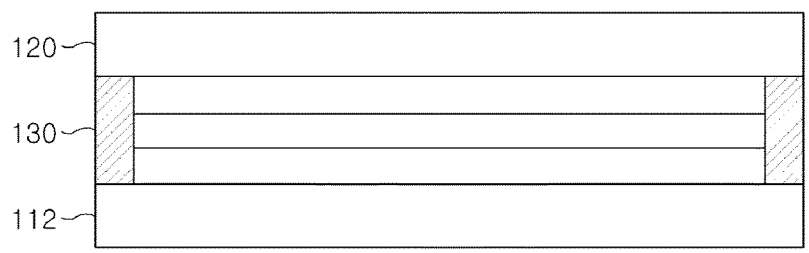

As illustrated in FIG. 7, the solder is heated to bond the deposition substrate 112 and the lamination substrate 120, and thereby the laminated superconducting wire material is manufactured.

FIGS. 8 to 12 are cross-sectional views sequentially illustrating a method for manufacturing a superconducting wire material according to another embodiment of the present invention.

Figure 8:
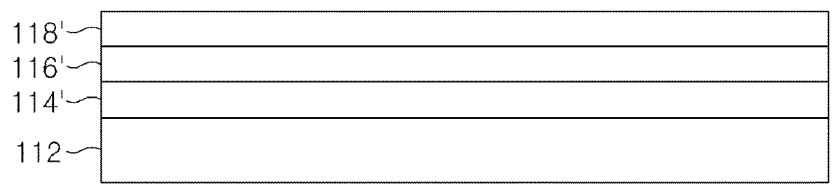
FIGS. 8 to 12 are cross-sectional views sequentially illustrating a method for laminating a superconducting wire material according to another embodiment of the present invention.

Referring to FIG. 8, the laminated structure of a buffer layer 114', a superconducting layer 116' and a stabilization layer 118' is formed on the entire surface of the deposition substrate 112.

Figure 9:
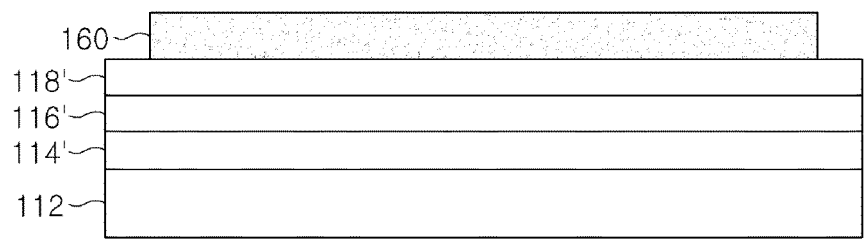

Referring to FIG. 9, a mask pattern 160 is formed on the buffer layer 114', the superconducting layer 116' and the stabilization layer 118'.

The mask pattern 160 may be implemented by a common photolithography process. That is, a photoresist is coated on the stabilization layer 118', photosensitization and etching techniques are applied to open part of an edge of the stabilization layer, and thereby the mask pattern 160 may be formed.

Figure 10:
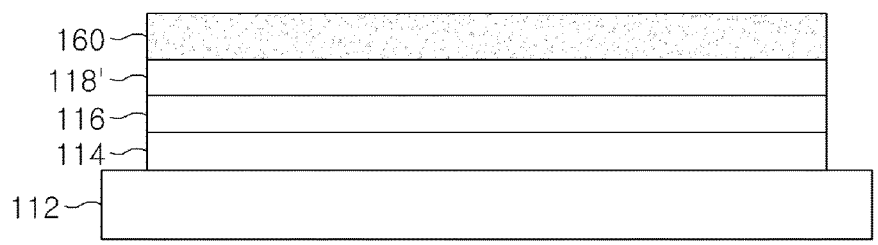

Referring to FIG. 10, the open part of the superconducting layer, the buffer layer and the stabilization layer is etched with the mask pattern 160 as a mask. The etching may be performed by a drying etching such as a well-known plasma etching, etc., and/or a wet etching by an etching solution. In the case of the wet etching, different etching solutions may be used for removing the stabilization layer, the buffer layer and the superconducting layer.

The laminated structure patterns 114, 116 and 118 including the superconducting layer, the buffer layer and the stabilization layer in which the metal substrate is exposed by the etching are obtained.

Figure 11:
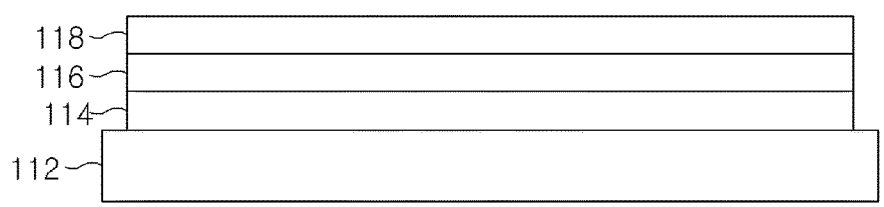

As illustrated in FIG. 11, the mask pattern 160 is removed. The removal of the mask pattern may be performed by a common technique such as a strip process or an etching process, etc.

Figure 12:
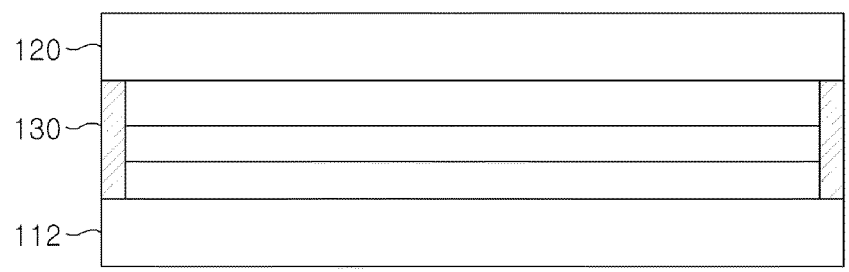

Additionally, as illustrated in FIG. 12, the lamination substrate 120 is arranged on the deposition substrate 112 which went through the above process, and both substrates 112 and 120 are bonded by the solder 130, and thereby the superconducting wire material having the laminated structure may be manufactured.

Figure 13:
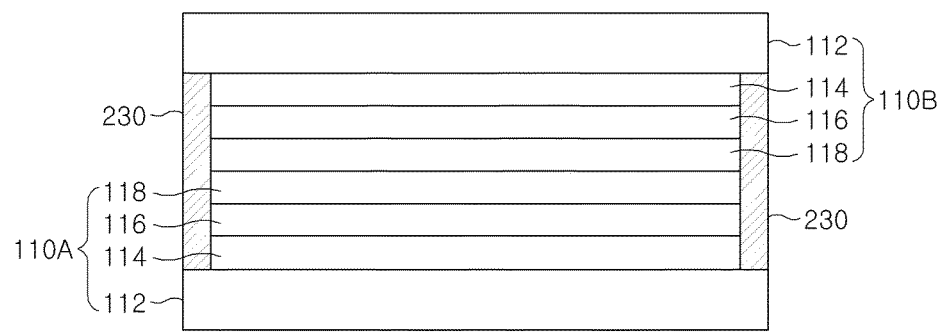
FIG. 13 is a view illustrating a cross section of a laminated structure of a superconducting wire material according to another embodiment of the present invention.

FIG. 13 is an exemplary view illustrating a laminated structure of a superconducting wire material according to another embodiment of the present invention.

Referring to FIG. 13, a superconducting wire material 200 includes two laminated structures 110A and 110B which are opposing to each other.

Each laminated structure 110A and 110B includes the deposition substrate 112, and the buffer layer 114, the superconducting layer 116 and the stabilization layer 118 sequentially laminated on the deposition substrate. With the same method as described above, each laminated structure 110A and 110B is formed such that the metal substrate is exposed in the width direction on both sides of the deposition substrate. The solder 230 fills a space formed by the regions in which the metal substrate is exposed. As such, the superconducting wire material can be laminated by bonding the laminated structures opposing to each other. In this case, there is an advantage that an additional lamination substrate for the lamination may not be used.

Figure 14:
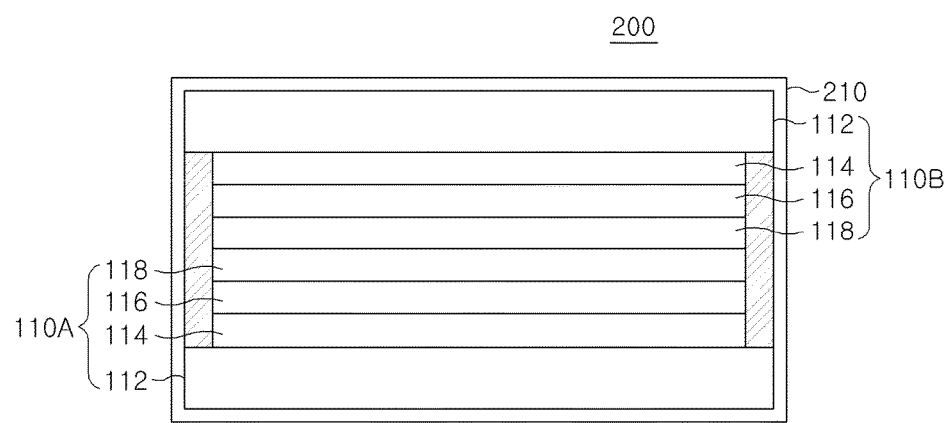
FIGS. 14 to 16 are views illustrating modification examples of the embodiment of FIG. 13.

FIG. 14 is a view illustrating a modification example of the superconducting wire material explained with reference to FIG. 13. An additional plating layer 210 is formed around the superconducting wire material 200. The plating layer may play a role of facilitating the soldering of an electrode.

Figure 15:
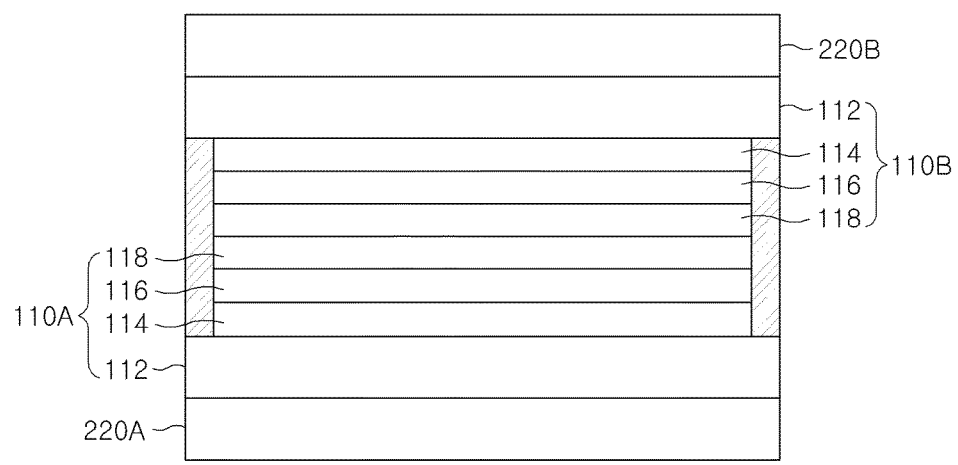

FIG. 15 is a view illustrating another modification example of the superconducting wire material explained with reference to FIG. 13. Unlike FIG. 13, lamination substrates 220A and 220B are used below and on the laminated structures 110A and 110B. This structure is applicable when rigidity of the deposition substrate needs to be reinforced. Of course, the lamination substrate 220 of the present invention may be applied to any one of on or below the laminated structures.

Figure 16:
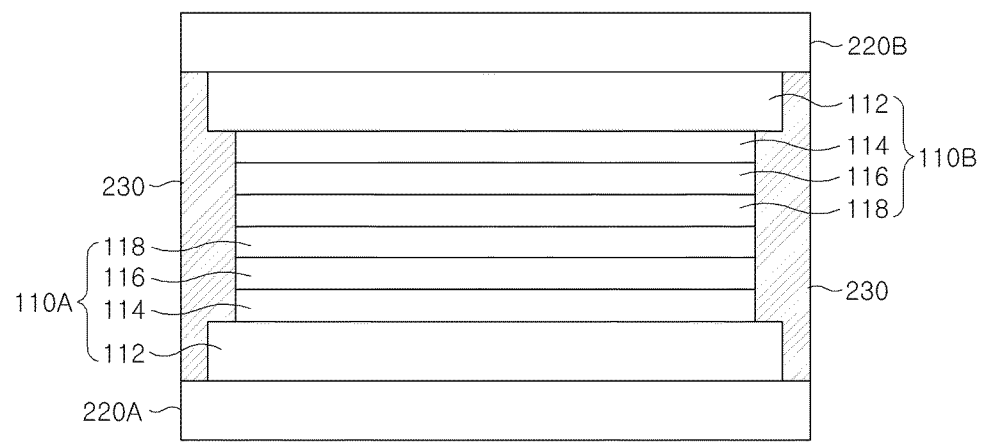

FIG. 16 is a view illustrating a modification example of the superconducting wire material explained with reference to FIG. 15. Unlike FIG. 15, a substrate with a greater width extending and protruding in the width direction of the deposition substrate is used as lamination substrates 220A and 220B. By the use of the lamination substrate 220, the solder 230 may more firmly bond the deposition substrate 112 and the lamination substrates 220A and 220B.

Although the exemplary embodiments of the present invention have been described, it is understood by a person ordinarily skilled in the art that the present invention should not be limited to these exemplary embodiments and that various changes and modifications can be made within the scope of the present invention as long as they do not depart from the technical spirit of the present invention.

What is claimed is:

1. A superconducting wire material comprising:
 a deposition substrate having a first width;
 a laminated structure comprising a buffer layer, a superconducting layer and a stabilization layer sequentially disposed on the deposition substrate, the buffer layer being disposed directly on the deposition substrate, the laminated structure having a second width which is smaller than the first width and recessed spaces at both ends in a width direction;
 a lamination substrate having a third width that is substantially the same as the first width of the deposition substrate; and
 a solder filling the recessed spaces thereby soldering the deposition substrate with the lamination substrate,
 wherein the stabilization layer includes first and second layers, the first layer including any one of gold, silver, platinum, palladium, and a combination thereof, the second layer including any one of copper, aluminum, and a combination thereof.

2. The superconducting wire material of claim 1, wherein the lamination substrate comprises one material selected from the group consisting of stainless steel, a copper alloy and a nickel alloy.

3. The superconducting wire material of claim 1, wherein the solder comprises at least one metal selected from the group consisting of silver, lead, tin, bismuth, aluminum, zinc and indium, or an alloy thereof.

* * * * *